United States Patent
Lee et al.

(10) Patent No.: US 8,099,658 B2
(45) Date of Patent: Jan. 17, 2012

(54) REDUCED COMPLEXITY VITERBI DECODER

(75) Inventors: Seok-Jun Lee, Allen, TX (US); Srinivas Lingam, Dallas, TX (US); Anuj Batra, Dallas, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1112 days.

(21) Appl. No.: 11/932,591

(22) Filed: Oct. 31, 2007

(65) Prior Publication Data

US 2009/0110126 A1   Apr. 30, 2009

(51) Int. Cl.
*H03M 13/03* (2006.01)

(52) U.S. Cl. .......... 714/796; 714/794; 714/746

(58) Field of Classification Search .......... 714/796, 714/794, 790, 746, 795
See application file for complete search history.

(56) References Cited

U.S. PATENT DOCUMENTS

| | | | | |
|---|---|---|---|---|
| 5,859,861 | A * | 1/1999 | Oh | 714/795 |
| 7,679,853 | B2 * | 3/2010 | Song et al. | 360/59 |
| 7,917,565 | B2 * | 3/2011 | Kuo et al. | 708/409 |
| 2004/0120427 | A1 * | 6/2004 | Lee et al. | 375/341 |
| 2004/0122883 | A1 * | 6/2004 | Lee et al. | 708/490 |
| 2005/0044474 | A1 * | 2/2005 | Zaboronski et al. | 714/794 |

* cited by examiner

*Primary Examiner* — Fritz Alphonse
(74) *Attorney, Agent, or Firm* — Steven A. Shaw; W. James Brady; Frederick J. Telecky, Jr.

(57) ABSTRACT

A Viterbi decoder includes a branch metric unit, an add-compare select unit coupled to the branch metric unit, and a trace-back unit coupled to the add-compare select unit. The branch metric unit includes a branch metric computation unit coupled to a thresholder unit. The branch metric computation unit is configured to compute a branch metric. The thresholder unit is configured to compare the branch metric with a threshold value. If the branch metric is greater than the threshold value, the thresholder unit is configured to forward the threshold value to the add-compare select and not forward the branch metric to the add-compare select unit. Implementing such a branch metric ceiling allows for a predictable reduction in the significant bits of calculations in the Viterbi decoder, which allows for reduction of complexity via elimination of gates and storage elements.

21 Claims, 2 Drawing Sheets

REDUCED COMPLEXITY VITERBI DECODER

CROSS-REFERENCE TO RELATED APPLICATIONS

None.

BACKGROUND

Andrew Viterbi developed a decoding algorithm in the 1960s that has come to be known as the "Viterbi algorithm." A decoder that implements the Viterbi algorithm is known as a Viterbi decoder. The Viterbi algorithm is used to decode a particular convolutional code using maximum-likelihood concepts, and Viterbi decoders currently decode data communications, wired communications, and wireless voice communications used in cellular phones, satellites, modems, and other communication devices. Viterbi decoders, unfortunately, are typically relatively complex. Thus, any reduction in the complexity of Viterbi decoders would be advantageous.

SUMMARY

Devices and methods for reducing the complexity of Viterbi decoders are described herein. In at least some disclosed embodiments, a Viterbi decoder includes a branch metric unit, an add-compare select unit coupled to the branch metric unit, and a trace-back unit coupled to the add-compare select unit. The trace-back unit determines the maximum-likelihood ("ML") path. The branch metric unit includes a branch metric computation unit coupled to a thresholder unit. The branch metric computation unit is configured to compute a branch metric. The thresholder unit is configured to compare the branch metric with a threshold value. If the branch metric, which computes the distance between the desired signal and the received signal, is greater than the threshold value, the thresholder unit is configured to forward the threshold value to the add-compare select unit and not forward the branch metric to the add-compare select unit. If the branch metric, which computes the correlation between the possibly transmitted signal and the received signal, is less than the threshold value, the thresholder unit is configured to forward the threshold value to the add-compare select unit and not forward the branch metric to the add-compare select unit. Implementing such a branch metric ceiling allows for a predictable reduction in the significant bits of calculations in the add-compare select unit of the Viterbi decoder, which allows for reduction of complexity via elimination of gates and storage elements, as the add-compare select unit takes most of the logic area in the Viterbi decoder circuit.

In other disclosed embodiments, a Viterbi decoder includes a branch metric unit, an add-compare select unit coupled to the branch metric unit, and a trace-back unit coupled to the add-compare select unit. The branch metric unit includes a branch metric computation unit coupled to a thresholder unit. The branch metric computation unit is configured to compute a branch metric. The thresholder unit is configured to compare the branch metric to a threshold value. If the correlation branch metric is less than the threshold value, the thresholder unit is configured to forward the threshold value and not forward the branch metric to the add-compare select unit.

In yet other disclosed embodiments, a method includes computing a branch metric, comparing the branch metric to a threshold value, and, if the partial distance branch metric is greater than the threshold value, forwarding the threshold value and not forwarding the partial distance branch metric, or if the correlation branch metric is greater than the threshold value, forwarding the threshold value and not forwarding the correlation branch metric.

In even further disclosed embodiments a computer-readable medium stores a software program that, when executed by a processor, causes the processor to compute a branch metric, compare the branch metric to a threshold value, and, if the partial distance branch metric is greater than the threshold value, forward the threshold value and not forward the partial distance branch metric, or if the correlation branch metric is greater than the threshold value, forwarding the threshold value and not forwarding the correlation branch metric.

In still other disclosed embodiments, an electronic device includes a branch metric unit and an add-compare select unit coupled to the branch metric unit. The branch metric unit includes a branch metric computation unit coupled to a thresholder unit. The branch metric computation unit is configured to compute a branch metric. The thresholder unit is configured to compare the branch metric with a threshold value. If the partial distance branch metric is greater than a threshold value, the thresholder unit is configured to forward the threshold value to the add-compare select unit and not forward the partial distance branch metric to the add-compare select unit. If the correlation branch metric is less than a threshold value, the thresholder unit is configured to forward the threshold value to the add-compare select unit and not forward the correlation branch metric to the add-compare select unit.

These and other features and advantages will be more clearly understood from the following detailed description taken in conjunction with the accompanying drawings and claims.

BRIEF DESCRIPTION OF THE DRAWINGS

For a more complete understanding of the present disclosure, reference is now made to the accompanying drawings and detailed description, wherein like reference numerals represent like parts.

NOTATION AND NOMENCLATURE

Certain terms are used throughout the following claims and discussion to refer to particular components. This document does not intend to distinguish between components that differ in name but not function. In the following discussion and in the claims, the terms "including" and "comprising" are used in an open-ended fashion, and thus should be interpreted to mean "including but not limited to". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

Communication technology involves a transmitter sending a signal to a receiver. Such a signal may be sent over wires or wireless channels. The received signal may not be the same as the transmitted signal due to various factors, e.g., noise. The term "decoding," as used in the communication context, refers to using the received signal to estimate which transmit signal, out of multiple possible transmit signals, was transmitted. Considering a mapping of all the possibly transmitted signals onto a coordinate system, a similarly mapped received signal will not be located exactly on the transmitted signal, as expected, due to the factors mentioned above. Rather, the received signal may be in between the possibly transmitted signals, closer to some, and further from others. Decoders using maximum likelihood techniques employ the assumption that the further away the received signal is from a particular possibly transmitted signal on the mapping, the less likely the particular possibly transmitted signal is the transmitted signal. Accordingly, the closer the received signal is to a particular possibly transmitted signal, the more likely the particular possibly transmitted signal is the transmitted signal.

Figure 1A:
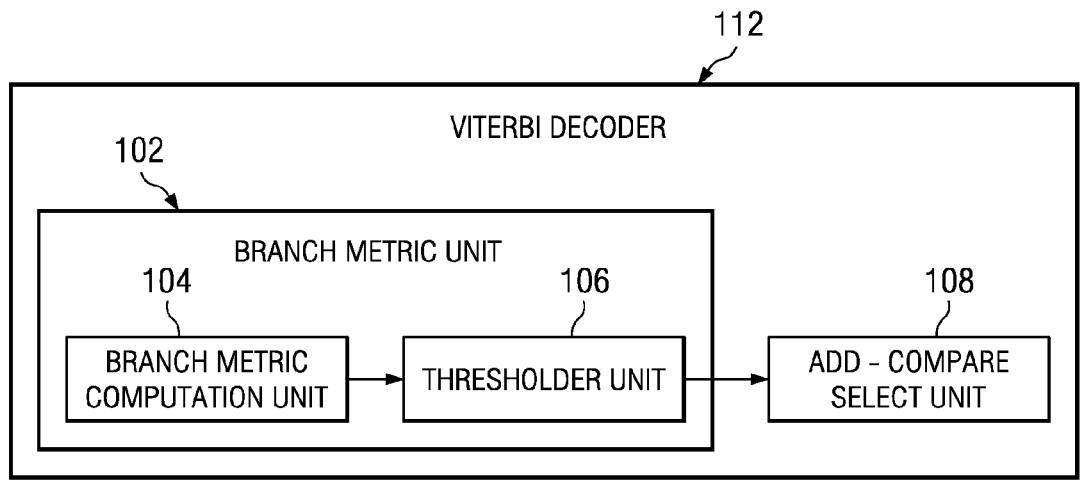
FIG. 1A illustrates a Viterbi decoder constructed in accordance with at least some illustrative embodiments.
Figure 1B:
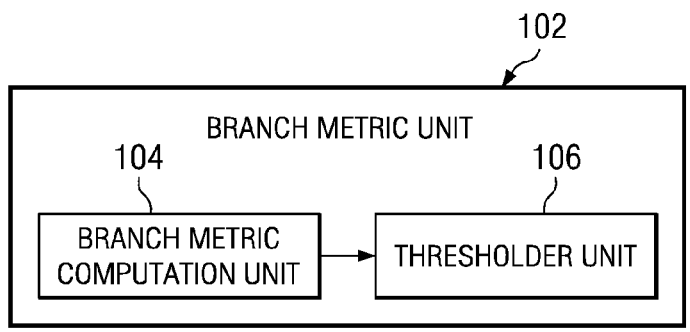
FIG. 1B isolates the branch metric unit of FIG. 1A in accordance with at least some illustrative embodiments.

FIG. 1A illustrates a Viterbi decoder 112 ("decoder") in accordance with at least some embodiments. In various embodiments the decoder 112 comprises a branch metric unit 102 coupled to an add-compare select unit 108, and a trace-back unit 110 coupled to the add-compare select unit 108. The outputs of the add-compare select unit 108 are passed to the trace-back unit 110, and also provide feedback. The trace-back unit 110 determines the maximum-likelihood path for decoding. FIG. 1B illustrates the branch metric unit 102 isolated from the decoder 112. The branch metric unit 102 comprises a branch metric computation unit 104 coupled to a thresholder unit 106. The branch metric computation unit 104 calculates "branch metrics" for each possibly transmitted signal. Branch metrics are partial distances between the received signal and the possibly transmitted signals on the mapping as discussed above. Branch metrics may be calculated by computing the absolute value of the difference between the received signal and a possibly transmitted signal, and squaring the result. The branch metric computation unit 104 forwards each calculated branch metric to the thresholder unit 106.

Disregarding the thresholder unit 106 for a moment, the add-compare select unit 108 is configured to receive the branch metrics as inputs. The add-compare select unit 108 is configured to sum the branch metrics, the partial distances, into "state metrics." The add-compare select unit 108 is also configured to select possibly transmitted signals, corresponding to the smaller state metrics, from consideration as the transmitted signal by comparing each state metric with other state metrics. Such selection occurs recursively, until only the smallest state metric remains, representing the possibly transmitted signal which is the closest to the received signal.

Now considering the thresholder unit 106, the thresholder unit 106 compares each branch metric to a threshold value. Any method of comparing two numbers may be used, but lower complexity implementations are preferred. If a branch metric is greater than the threshold value, the thresholder unit 106 preferably forwards the threshold value to the add-compare select unit 108, and does not forward the branch metric to the add-compare select unit 108. In at least some embodiments, the thresholder unit 106 forwards the threshold value to other logic (not pictured). In at least some embodiments, the thresholder unit 106 forwards the threshold value if the branch metric is greater or equal to the threshold value.

If the branch metric is less than or equal to the threshold value, the thresholder unit 106 preferably forwards the branch metric to the add-compare select unit 108, and does not forward the threshold value to the add-compare select unit 108. In at least some embodiments, the thresholder unit 106 forwards the branch metric to other logic (not pictured). In at least some embodiments, the thresholder unit 106 forwards the branch metric if the branch metric is less than the threshold value.

In various embodiments, the add-compare select unit 108 implements a Radix-$2^n$ architecture, n being a non-negative integer, and representing the number of bits that are processed per clock cycle. A Radix-$2^n$ architecture processes n trellis sections per recursion. For example, if n=3, the add-compare select unit 108 implements a Radix-8 architecture, three trellis sections are processed per clock cycle. Processing of n trellis sections per cycle requires a radix-$2^n$ add-compare select unit which processes $2^n$ possible candidates. As n increases linearly, the complexity of the add-compare select unit 108, and thus the complexity of decoder 112, increases exponentially. Thus, in at least some embodiments, the threshold value is selected such that the threshold value causes calculations by the add-compare select unit 108 to lose at least 1 bit of precision as compared to calculations by the add-compare select unit 108 if the branch metric was forwarded. In this way, the threshold value acts as a ceiling for the branch metric, and provides predictability that the add-compare select unit 108 preferably will not perform an operation in which the loss of precision is significant. Such a predictable reduction in precision allows for a reduction in complexity of the add-compare select unit 108 in the form of eliminating gates and storage elements for state metrics, which of course corresponds to a reduction in complexity of the decoder 112.

The thresholder unit 106 selects the threshold value based on the precision of the branch metric. Preferably, the threshold value is equal to $2^{B-1}-1$ for an easy implementation in circuitry, where B is the number of bits of precision of the branch metric. However, in at least some embodiments, the thresholder unit 106 uses a threshold value selected by other logic.

Figure 2:
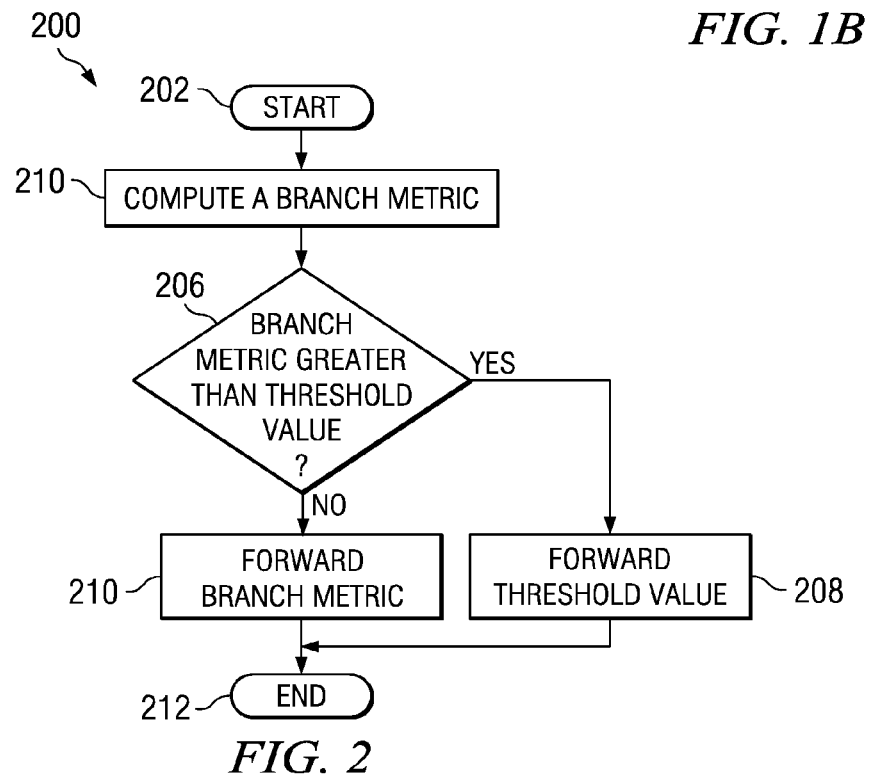
FIG. 2 illustrates a method for reducing the complexity of a Viterbi decoder in accordance with at least some illustrative embodiments.

FIG. 2, beginning at 202 and ending at 212, illustrates a method 200 for reducing the complexity of a decoder in accordance with at least some embodiments. At 204, a branch metric is computed. At 206, the branch metric is compared to a threshold value. If the branch metric is greater than the threshold value, then the threshold value is forwarded at 208. If the branch metric is less than or equal to the threshold value, then the branch metric is forwarded at 210. In at least some embodiments, the method comprises forwarding the branch metric if the branch metric is less than or equal to a threshold value. In at least some embodiments, the threshold value is selected based on the precision of the branch metric. Preferably, the threshold value is selected to equal to $2^{B-1}-1$, where B is number of bits of the precision of the branch metric.

Figure 3:
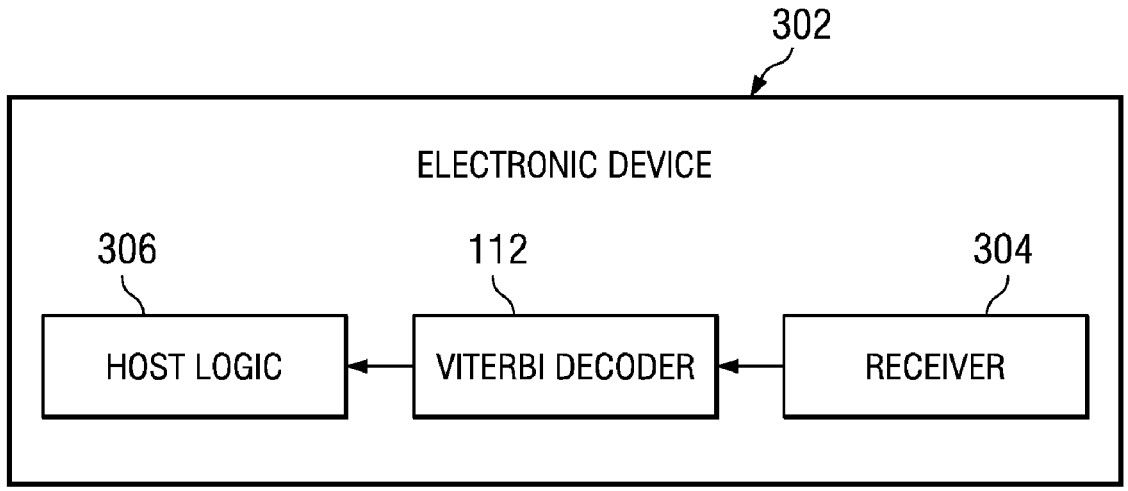
FIG. 3 illustrates an electronic device comprising the reduced complexity Viterbi decoder constructed in accordance with at least some illustrative embodiments.

FIG. 3 illustrates an electronic device 302 comprising the reduced complexity Viterbi decoder 112 constructed in accordance with at least some illustrative embodiments as described above. As mentioned, a receiver 304 receives a receive signal, and the Viterbi decoder 112 decodes the signal as described above. In at least some embodiments, the receiver 304 is an antenna. Next, the estimated transmitted signal is passed to the host logic 306 of the electronic device 302. In at least some embodiments, the electronic device 302 is a modem.

In at least some embodiments, instead of a partial distance, a branch metric is defined as the correlation value between the received signal and the possibly transmitted signal. In such embodiments, the add-compare select unit 108 is configured to select possibly transmitted signals corresponding to the larger state metrics by comparing each state metric with other state metrics. Such selection occurs recursively, until only the largest state metric remains, representing the maximum likelihood path.

Considering the thresholder unit 106 in such embodiments, the thresholder unit 106 compares each branch metric to a threshold value. Any method of comparing two numbers may be used, but lower complexity implementations are preferred. If a branch metric is less than the threshold value, the thresholder unit 106 preferably forwards the threshold value to the add-compare select unit 108, and does not forward the branch metric to the add-compare select unit 108. In at least some embodiments, the thresholder unit 106 forwards the threshold value to other logic (not pictured). In at least some embodiments, the thresholder unit 106 forwards the threshold value if the branch metric is less than or equal to the threshold value.

If the branch metric is greater than or equal to the threshold value in such embodiments, the thresholder unit 106 preferably forwards the branch metric to the add-compare select unit 108, and does not forward the threshold value to the add-compare select unit 108. In at least some embodiments, the thresholder unit 106 forwards the branch metric to other logic (not pictured). In at least some embodiments, the thresholder unit 106 forwards the branch metric if the branch metric is greater than the threshold value.

Figure 4:
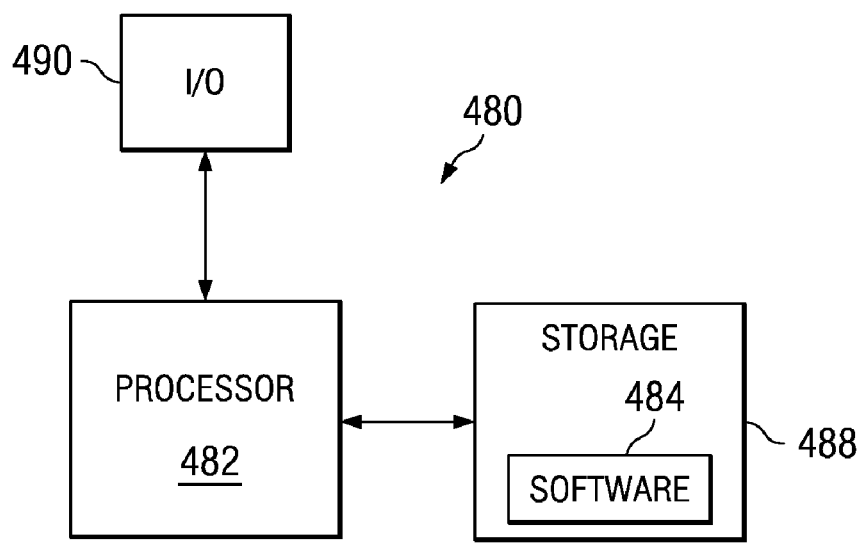
FIG. 4 illustrates a general-purpose computer suitable for implementing one or more embodiments described herein.

The system described above may be implemented on any general-purpose computer with sufficient processing power, memory resources, and throughput capability to handle the necessary workload placed upon the computer. FIG. 4 illustrates a typical, general-purpose computer system 480 suitable for implementing one or more embodiments disclosed herein. The computer system 480 includes a processor 482 (which may be referred to as a central processor unit or CPU) that is in communication with memory devices including storage 488, and input/output (I/O) 490 devices. The processor may be implemented as one or more CPU chips.

In various embodiments, the storage 488 comprises a computer-readable medium such as volatile memory (e.g., RAM), non-volatile storage (e.g., Flash memory, hard disk drive, CD ROM, etc.), or combinations thereof. The storage 488 comprises software 484 that is executed by the processor 482. One or more of the actions described herein are performed by the processor 482 during execution of the software 484.

The above disclosure is meant to be illustrative of the principles and various embodiment of the present invention. Numerous variations and modifications will become apparent to those skilled in the art once the above disclosure is fully appreciated. For example, the electronic device 302 may be a modem, a cellular phone, etc. It is intended that the following claims be interpreted to embrace all variations and modifications.

What is claimed:

1. A Viterbi decoder, comprising:
   a branch metric unit comprising a branch metric computation unit coupled to a thresholder unit, the branch metric computation unit configured to compute a branch metric; and
   an add-compare select unit coupled to the branch metric unit;
   wherein the thresholder unit is configured to compare the branch metric to a threshold value, and
   if the branch metric is greater than the threshold value, the thresholder unit is further configured to forward the threshold value to the add-compare select unit and not forward the branch metric to the add-compare select unit;
   if the branch metric is less than or equal to the threshold value, the thresholder unit is further configured to forward the branch metric to the add-compare select unit and not forward the threshold value to the add-compare select unit.

2. The Viterbi decoder of claim 1, wherein forwarding the threshold value causes calculations by the add-compare select unit to lose at least 1 bit of precision as compared to forwarding the branch metric.

3. The Viterbi decoder of claim 1, wherein the Viterbi decoder implements a Radix-$2^n$ architecture, n being a non-negative integer.

4. The Viterbi decoder of claim 1, wherein the thresholder unit is further configured to select the threshold value based on a precision of the branch metric.

5. The Viterbi decoder of claim 1, wherein the threshold value is equal to $2^{B-1}-1$, B being a precision of the branch metric.

6. The Viterbi decoder of claim 1, wherein the branch metric is a partial distance between a received signal and a possibly transmitted signal.

7. A Viterbi decoder, comprising:
   a branch metric unit comprising a branch metric computation unit coupled to a thresholder unit, the branch metric computation unit configured to compute a branch metric; and
   an add-compare select unit coupled to the branch metric unit;
   wherein the thresholder unit is configured to compare the branch metric to a threshold value, and
   if the branch metric is less than the threshold value, the thresholder unit is further configured to forward the threshold value to the add-compare select unit and not forward the branch metric to the add-compare select unit;
   if the branch metric is greater than or equal to the threshold value, the thresholder unit is further configured to forward the branch metric to the add-compare select unit and not forward the threshold value to the add-compare select unit.

8. The Viterbi decoder of claim 7, wherein forwarding the threshold value causes calculations by the add-compare select unit to lose at least 1 bit of precision as compared to forwarding the branch metric.

9. The Viterbi decoder of claim 7, wherein the Viterbi decoder implements a Radix-$2^n$ architecture, n being a non-negative integer.

10. The Viterbi decoder of claim 7, wherein the thresholder unit is further configured to select the threshold value based on a precision of the branch metric.

11. The Viterbi decoder of claim 7, wherein the branch metric is a correlation between a received signal and a possibly transmitted signal.

12. A method, comprising:
computing a branch metric;
comparing the branch metric to a threshold value; and
if the branch metric is greater than the threshold value, forwarding the threshold value and not forwarding the branch metric to an add-compare select hardware unit;
if the branch metric is less than or equal to the threshold value, forwarding the branch metric and not forwarding the threshold value to the add-compare select hardware unit.

13. The method of claim 12, further comprising selecting a threshold value based on a precision of the branch metric.

14. The method of claim 12, further comprising selecting a threshold value equal to $2^{B-1}-1$, B being a precision of the branch metric.

15. The method of claim 12, wherein computing the branch metric comprises computing the branch metric, the branch metric comprising a partial distance between a received signal and a possibly transmitted signal.

16. A computer-readable medium storing a software program that, when executed by a processor, causes the processor to:
compute a branch metric;
compare the branch metric to a threshold value; and
if the branch metric is greater than the threshold value, forward the threshold value and not forward the branch metric;
if the branch metric is less than or equal to the threshold value, forward the branch metric and not forward the threshold value.

17. The computer-readable medium of claim 16, further causing the processor to select a threshold value based on a precision of the branch metric.

18. The computer-readable medium of claim 16, further causing the processor to select a threshold value equal to $2^{B-1}-1$, B being a precision of the branch metric.

19. The computer-readable medium of claim 16, wherein computing the branch metric causes the processor to compute the branch metric, the branch metric comprising a correlation between a received signal and a possibly transmitted signal.

20. An electronic device, comprising:
a branch metric unit comprising a branch metric computation unit coupled to a thresholder unit, the branch metric computation unit configured to compute a branch metric; and
an add-compare select unit coupled to the branch metric unit;
wherein the thresholder unit is configured to compare the branch metric to a threshold value, and
if the branch metric is greater than the threshold value, the thresholder unit is further configured to forward the threshold value to the add-compare select unit and not forward the branch metric to the add-compare select unit;
if the branch metric is less than or equal to the threshold value, the thresholder unit is further configured to forward the branch metric and not forwarding the threshold value to the add-compare select hardware unit.

21. The electronic device of claim 20, wherein the electronic device is a modem.

* * * * *